United States Patent
Bloch

(10) Patent No.: US 6,646,539 B2
(45) Date of Patent: Nov. 11, 2003

(54) TEMPERATURE-COMPENSATED SEMICONDUCTOR RESISTOR AND SEMICONDUCTOR INTEGRATED CIRCUIT HAVING THE SEMICONDUCTOR RESISTOR

(75) Inventor: Martin Bloch, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/999,327

(22) Filed: Oct. 31, 2001

(65) Prior Publication Data

US 2002/0089407 A1 Jul. 11, 2002

(30) Foreign Application Priority Data

Oct. 31, 2000 (DE) .......................... 100 53 957

(51) Int. Cl.$^7$ ................................ H01L 7/06
(52) U.S. Cl. .................... 338/9; 338/7; 338/8; 338/309
(58) Field of Search .............................. 338/7, 8, 9, 36, 338/42, 309

(56) References Cited

U.S. PATENT DOCUMENTS

| | | | |
|---|---|---|---|
| 3,484,658 A | | 12/1969 | Komatsu |
| 3,491,325 A | * | 1/1970 | Hu .................................. 338/7 |
| 4,063,210 A | * | 12/1977 | Collver ........................... 338/7 |
| 4,065,742 A | * | 12/1977 | Kendall et al. ................. 338/9 |
| 4,229,276 A | * | 10/1980 | Kobayashi et al. ......... 204/222 |
| 4,229,502 A | * | 10/1980 | Wu et al. ..................... 428/446 |
| 4,329,774 A | * | 5/1982 | Calligaro ........................ 338/7 |
| 4,622,856 A | * | 11/1986 | Binder et al. .................. 73/727 |
| 4,679,170 A | * | 7/1987 | Bourassa et al. ............ 365/154 |
| 5,196,233 A | * | 3/1993 | Chan et al. .................. 438/384 |
| 5,198,382 A | * | 3/1993 | Campbell et al. ........... 438/385 |
| 5,448,103 A | | 9/1995 | de Wit |
| 6,184,774 B1 | * | 2/2001 | Takeuchi ...................... 338/42 |
| 6,211,769 B1 | * | 4/2001 | Baldwin et al. ................ 338/7 |

OTHER PUBLICATIONS

N.G. Anantha et al.: "Composite Temperature–Compensated Resistor", IBM Technical Disclosure Bulletin, vol. 24, No. 7A, Dec. 1981, pp. 3405–3406.

* cited by examiner

Primary Examiner—Karl D. Easthom
(74) Attorney, Agent, or Firm—Laurence A. Greenberg; Werner H. Stemer; Gregory L. Mayback

(57) ABSTRACT

A temperature-compensated semiconductor resistor includes two series-connected semiconductor resistance elements having mutually inverse resistive temperature-dependent responses in a temperature range of interest. The semiconductor resistance elements are preferably made of doped polycrystalline semiconductor material such as polycrystalline silicon that is oppositely doped, i.e. n-doped and p-doped, respectively. A semiconductor integrated circuit, in particular a CMOS circuit, containing a semiconductor resistor, is also provided.

5 Claims, 3 Drawing Sheets

TEMPERATURE-COMPENSATED SEMICONDUCTOR RESISTOR AND SEMICONDUCTOR INTEGRATED CIRCUIT HAVING THE SEMICONDUCTOR RESISTOR

BACKGROUND OF THE INVENTION

FIELD OF THE INVENTION

The invention relates to a temperature-compensated semiconductor resistor. In particular, the invention relates to a semiconductor resistor which varies little with temperature in a temperature range of interest. In addition, the invention relates to a semiconductor integrated circuit in which such a semiconductor resistor is provided.

Electrical resistances can appear in various forms intentionally or unintentionally in semiconductor integrated circuits. In their unwanted form they constitute parasitic circuit elements having properties which must be estimated so that their negative effects can be minimized and countermeasures taken. If, however, semiconductor resistances are required for an electronic function, one must know their dimensions and electrical properties very precisely.

The classic form of a resistor integrated in a semiconductor circuit is a well resistor, i.e. a diffused or implanted p-region in a surrounding n-region. In standard CMOS circuits, such resistors are usually made of polycrystalline silicon with various characteristics. However, the disadvantage of typical CMOS resistors is that their resistance is highly temperature-dependent in the usual ambient temperature range. That can have detrimental effects on the performance of the semiconductor component, or lead to complete failure of the component.

SUMMARY OF THE INVENTION

It is accordingly an object of the invention to provide a temperature-compensated semiconductor resistor and a semiconductor integrated circuit having the semiconductor resistor, which overcome the hereinafore-mentioned disadvantages of the heretofore-known devices of this general type and which have an improved temperature response, in particular with a reduced temperature dependence in a temperature range of interest.

With the foregoing and other objects in view there is provided, in accordance with the invention, a temperature-compensated semiconductor resistor, comprising two series-connected semiconductor resistance elements having mutually inverse resistive temperature responses or temperature-dependent resistance courses, in a temperature range of interest that is the normal ambient temperature during operation of the associated semiconductor circuit. Thus, within this range, one of the two resistance elements should have a positive temperature coefficient i.e. an electrical resistance that increases as the temperature rises, and the other one should have a negative temperature coefficient, i.e. an electrical resistance that decreases as the temperature rises.

A first connecting contact is disposed at one end of the semiconductor resistor, that is to say on the first of the two semiconductor resistance elements. The other connecting contact is located at the other end of the semiconductor resistor, that is to say on the second of the two semiconductor resistance elements. This results in a series circuit including the semiconductor resistance elements, and the total resistance of the semiconductor resistor equals the sum of the resistances of the two semiconductor resistance elements. The inverse resistive temperature responses of each of the resistance elements with respect to each other provide mutual compensation, so that the process of addition means that the resistive temperature characteristic of the semiconductor resistor is relatively flat.

In accordance with another feature of the invention, the semiconductor resistance elements are made of oppositely doped polycrystalline semiconductor material, in particular polycrystalline silicon. In crystalline silicon, the conductivity with respect to the temperature is determined by the decreasing mobility of the charge carriers with increasing temperature. However, in polycrystalline silicon, the charge transport mechanisms across the grain boundaries must be taken into account. One can thus obtain a negative or positive temperature coefficient depending on the charge state of the crystal defects making up a grain boundary. In experiments, one observes in p-doped, particularly $p^+$-doped, polycrystalline silicon a resistance that increases with rising temperature, while in n-doped, particularly $n^+$-doped, polycrystalline silicon a resistance that falls with rising temperature is observed. In the semiconductor resistor according to the invention, one can select different doping concentrations for hi the oppositely doped semiconductor resistance elements.

In accordance with a concomitant feature of the invention, if the semiconductor resistance elements are formed from n-doped and p-doped semiconductor regions, they are physically separated by a high-conductivity connecting layer. The connecting layer provides a low resistance electrical connection between the two semiconductor resistance elements. The connecting layer may be a metallic layer or possibly even a very highly doped semiconductor layer. However, the n-doped and p-doped semiconductor regions must not be directly adjacent, since that would create an unwanted p-n junction.

Other features which are considered as characteristic for the invention are set forth in the appended claims.

Although the invention is illustrated and described herein as embodied in a temperature-compensated semiconductor resistor and a semiconductor integrated circuit having the semiconductor resistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
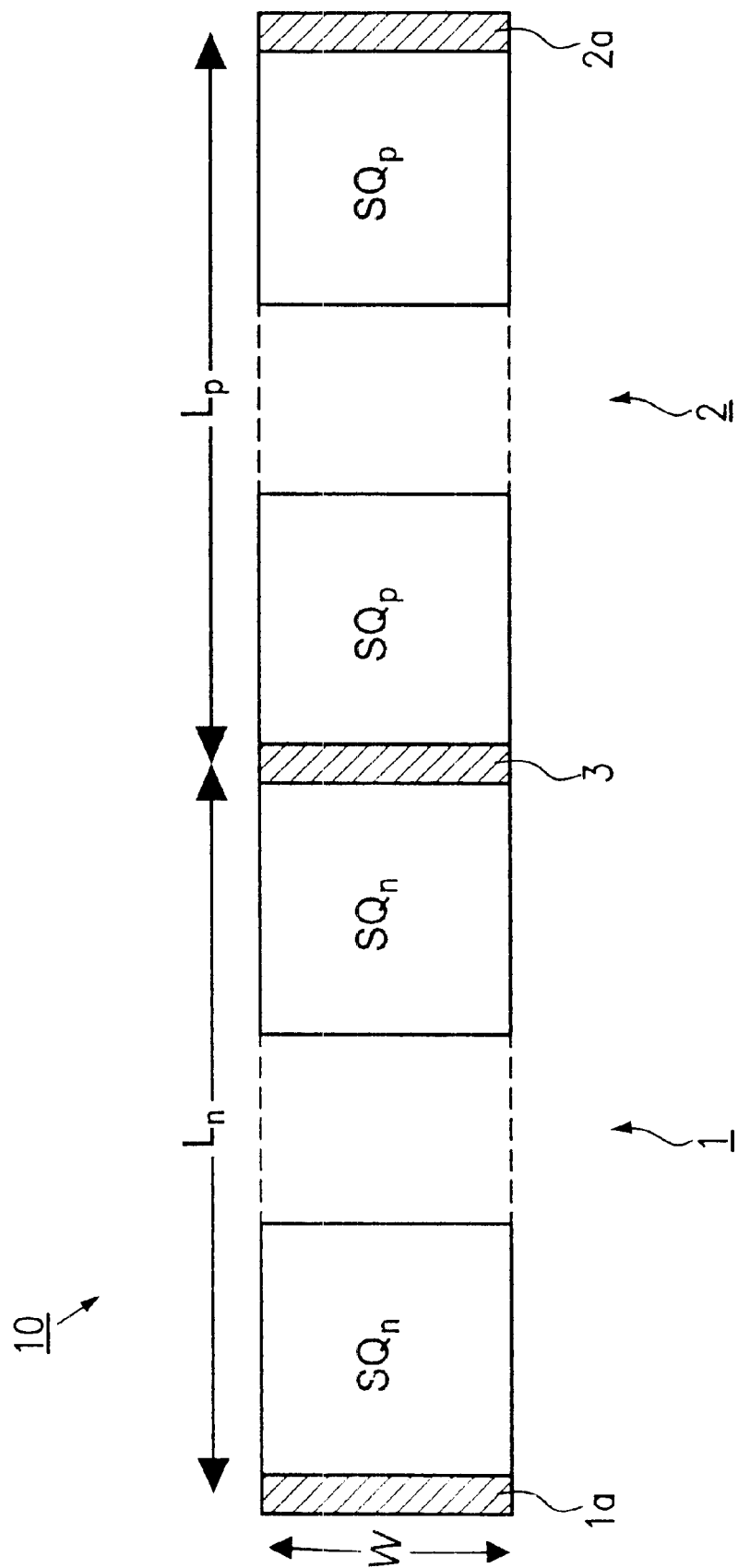
FIG. 1 is a diagrammatic, plan view of one embodiment of a semiconductor resistor according to the invention.

Referring now to the figures of the drawings in detail and first, particularly, to FIG. 1 thereof, there is seen a layout of a semiconductor resistor 10 according to the invention, which has two resistance elements 1 and 2 that are connected in series and made of oppositely doped polycrystalline substrates, in this case a relatively highly n-doped, i.e. $n^+$-doped resistance element 1, and a relatively highly p-doped, i.e. $p^+$-doped resistance element 2. A highly conductive connecting layer 3, for instance made of metal, lies between the resistance elements 1 and 2. Suitable contact layers, such as semiconductor alloy layers, may also be applied to interfaces between the resistance elements 1 and 2 and the metallic connecting layer 3. The resistance elements 1 and 2 must not be directly adjacent, since that would create a p-n junction. Suitable high-conductivity contact layers 1a and 2a are applied to side ends of the semiconductor resistor 10. External connections to the semiconductor resistor 10 can be made through the use of the contact layers 1a and 2a.

In an integrated CMOS circuit, the resistance elements 1 and 2 can be formed from suitably highly doped polysilicon layers embedded in a suitable way in the topography of the CMOS circuit and contacted at their (side) ends, as shown.

The semiconductor resistor 10 has a defined constant layer thickness (at right angles to the plane of the drawing) and a defined constant width W. Its overall length L is divided into lengths $L_n$ and $L_p$ of its resistance elements 1 and 2, so that $L=L_n+L_p$. The parameters L, $L_n$ and $L_p$ are set in such a way that, for given temperature-dependent specific resistances:

- on one hand, one obtains a defined resistance $R_{TCOMP}$ ($T_{COMP}$) for the semiconductor resistor 10 at a specific ambient temperature $T_{COMP}$; and
- on the other hand, the temperature dependence of the resistance at this temperature is a minimum. Mathematically, this means that the first derivative of R(T) at the point $T_{COMP}$ should equal zero.

As a geometrical and computational aid to determining L, $L_n$ and $L_p$, the resistance elements 1 and 2 are first divided into square base areas $SQ_n$ and $SQ_p$, having a length which therefore equals the width W of the semiconductor resistor 10. Such a base area is also given the arbitrary unit of 1 square. At the end of the calculation, the lengths $L_n$ and $L_p$ are each given as multiples of the lengths of $SQ_n$ and $SQ_p$, that is to say effectively of W. Thus, one obtains $L_n=S_n \times W$ and $L_p=S_p \times W$, where the numbers $S_n$ and $S_p$ give the ratio of the length/width of each resistance element, respectively. The numbers $S_n$ and $S_p$ are real positive numbers and need not be integers.

Figure 2A:
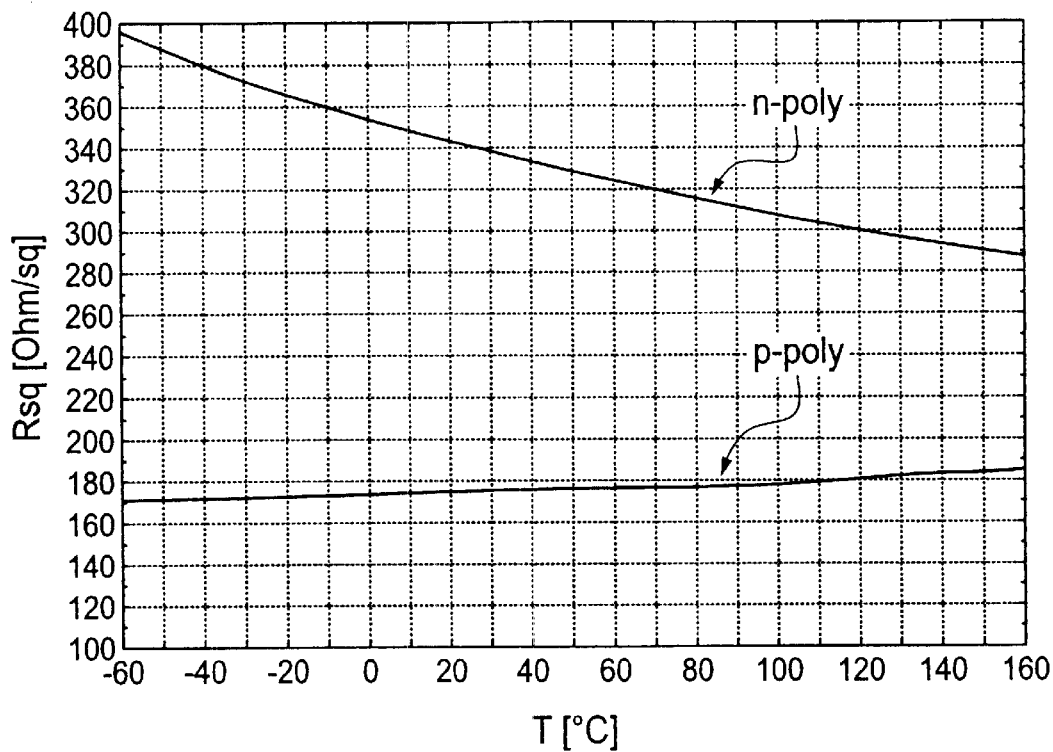
FIGS. 2A and 2B are graphs of temperature-dependent resistance curves for the semiconductor resistance elements.
Figure 2B:
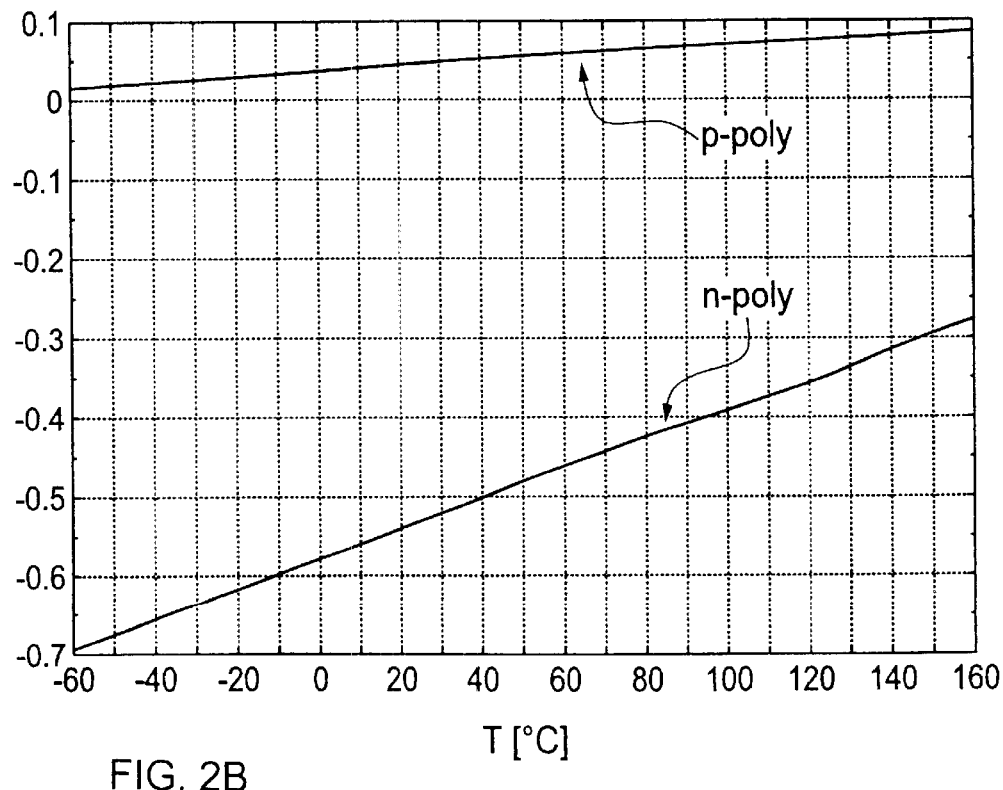

Next, one considers the temperature-dependent resistance of one square of the $n^+$-doped and the $p^+$-doped polysilicon, respectively. The corresponding curves are shown in FIGS. 2A and 2B. One can clearly see the negative gradient of the n-doped polyresistance in contrast to the slightly positive gradient of the p-doped polyresistance.

These curves can be represented as a series truncated to the second term as shown below in equation (1). The first derivative with respect to the temperature is then obtained from this in equation (2).

$$r(T)=r(T_0)\cdot[1+T_{C1}\cdot(T-T_0)+T_{C2}\cdot(T-T_0)^2] \text{ in } \Omega \quad (1)$$

$$\delta r(T)/\delta T=r(T_0)\cdot[T_{C1}+2\cdot T_{C2}\cdot(T-T_0)] \text{ in } \Omega/^\circ C. \quad (2)$$

where $T_{C1}$, $T_{C2}$ and $r(T_0)$ are values governed by the technology.

Since the two resistance elements 1 and 2 are connected in series, the following equation holds for the dependence of the total resistance R on the temperature:

$$R_{TCOMP}(T)=R^{n+}(T)+R^{p+}(T)=S_n r^{n+}(T)+S_p r^{p+}(T) \quad (3)$$

Differentiating equation (3) with respect to T, assuming there is a local optimum, i.e. a zero point of the first derivative, one obtains the following for the temperature $T_{COMP}$:

$$\delta R_{TCOMP}(T=T_{COMP})/\delta T=S_n\cdot\delta r^{n+}(T)/\delta T+S_p\cdot\delta r^{p+}(T)/\delta T=0 \quad (4)$$

Therefore, and applying equation (2), the resistance ratio is defined as:

$$K = R^{n+}/R^{p+} = S_n/S_p = \{-r^{p+}(T_0)\cdot[T_{C1}^{p+} + 2\cdot T_{C2}^{p+}\cdot(T_{COMP}-T_0)]/ \quad (5)$$
$$\{r^{n+}(T_0)\cdot[T_{C1}^{n+} + 2\cdot T_{C2}^{n+}\cdot(T_{COMP}-T_0)]\}$$

From which one can obtain the resistances:

$$R^{p+}=1/(1+k)\cdot R_{TCOMP} \text{ and } R^{n+}=k(1+k)\cdot R_{TCOMP} \quad (6)$$

In the following exemplary embodiment, the resistance curves shown in FIGS. 2A and 2B are assumed for one square of the resistance elements 1 and 2, respectively. The following parameter values apply to these curves:

|  | Units | $n^+$ poly-Si | $p^+$ poly-Si |
| --- | --- | --- | --- |
| $R(T_0)$ | $\Omega$ | 340 | 175 |
| $T_{C1}$ | $1/^\circ$ C. | $-1.55 \times 10^{-3}$ | $2.75 \times 10^{-4}$ |
| $T_{C2}$ | $1/^\circ$ C.$^2$ | $2.827 \times 10^{-6}$ | $9.9 \times 10^{-7}$ |

Using these resistance elements one should obtain a resistance $R_{COMP}$ ($T_{COMP}$)=100,000 $\Omega$, $T_{COMP}$=50° C. and $T_0$=27° C.

Applying equations (5) and (6) under these assumptions yields k=0.116 and length/width ratios for the resistance elements of $S_n$=54 and $S_p$=466. The surface areas of the resistance elements are thus given by $R_{sq}^p$=466 squares and $R_{sq}^n$=54 squares.

Figure 3:
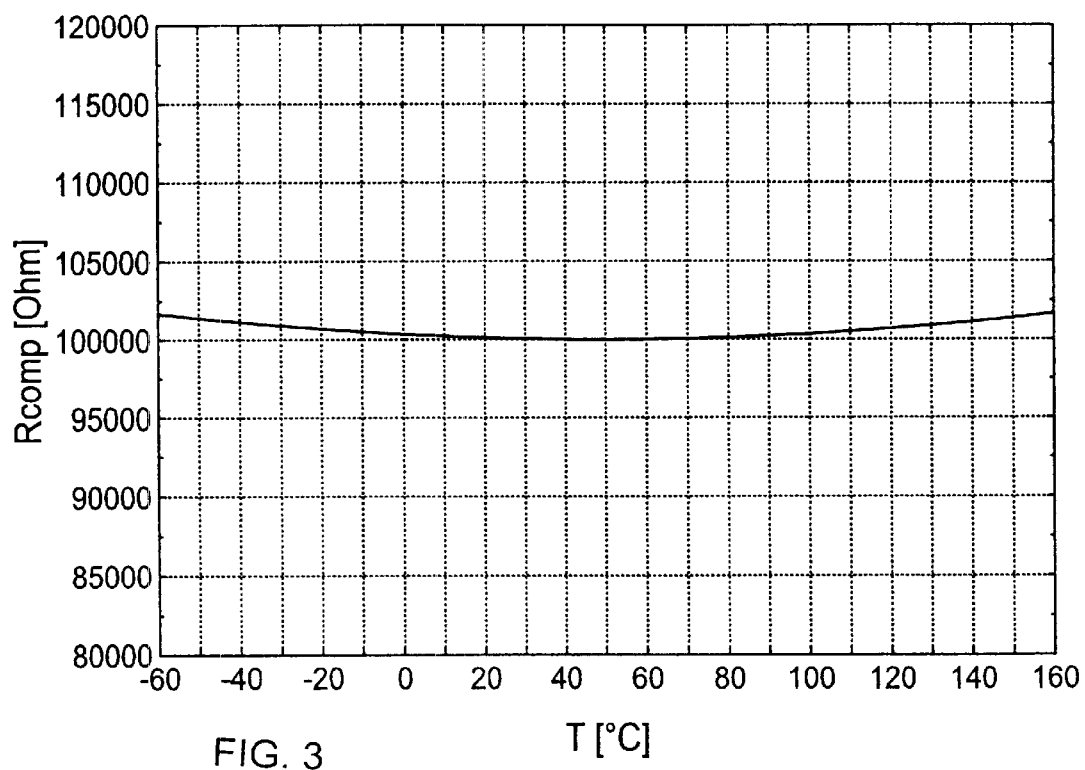
FIG. 3 is a graph of a temperature-dependent resistance curve for the semiconductor resistor.

The temperature response of the total resistance R is shown in FIG. 3. One can see the local minimum at R=100,000 $\Omega$.

The object according to the invention of creating a resistor that at a given temperature has a defined resistance which should have minimum variation with changes in the ambient temperature, is thus achieved.

I claim:

1. A temperature-compensated semiconductor resistor, comprising:

two series-connected semiconductor resistance elements having mutually inverse resistive temperature responses in a temperature range of interest, said semiconductor resistance elements formed of doped polycrystalline silicon material of opposite conductivity types; and an electrically conductive connecting layer sandwiched between and separating said semiconductor resistance elements.

2. The semiconductor resistor according to claim 1, wherein said electrically conductive connecting layer is made of metal.

3. The semiconductor resistor according to claim 1, including:

a defined semiconductor resistor width and a defined semiconductor resistor depth;

said resistance elements together having an overall length L;

said resistance elements having widths, being disposed adjacent each other along said widths and having sub-lengths $L_n$, $L_p$; and said overall length L and said sub-lengths $L_n$, $L_p$ explicitly determined by:
   a temperature-dependent resistance R(T) having a specified value at a defined temperature $T_{COMP}$; and
   the first derivative of the temperature-dependent resistance R(T) with respect to temperature dR/dT being equal to 0 at the defined temperature $T_{COMP}$.

4. A semiconductor integrated circuit, comprising:
   a temperature-compensated semiconductor resistor including two series-connected semiconductor resistance elements having mutually inverse resistive temperature responses in a temperature range of interest, said semiconductor resistance elements formed of doped polycrystalline silicon material of opposite conductivity types, and an electrically conductive connecting layer sandwiched between and separating said semiconductor resistance elements.

5. A CMOS circuit, comprising:
   a temperature-compensated semiconductor resistor including two series-connected semiconductor resistance elements having mutually inverse resistive temperature responses in a temperature range of interest, said semiconductor resistance elements formed of doped polycrystalline silicon material of opposite conductivity types, and an electrically conductive connecting layer sandwiched between and separating said semiconductor resistance elements.

* * * * *